United States Patent
Schechter et al.

(10) Patent No.: US 10,402,515 B2
(45) Date of Patent: *Sep. 3, 2019

(54) TEMPERATURE MONITORING WITH SIMULATED THERMAL BUFFER COMPUTED AT A BASE STATION

(71) Applicant: Digi International, Inc., Minnetonka, MN (US)

(72) Inventors: Harry J. Schechter, Needham, MA (US); Philip Trapasso, Brighton, MA (US)

(73) Assignee: Digi International, Inc., Minnetonka, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 15/675,625

(22) Filed: Aug. 11, 2017

(65) Prior Publication Data

US 2017/0344677 A1   Nov. 30, 2017

Related U.S. Application Data

(63) Continuation of application No. 15/241,696, filed on Aug. 19, 2016, now Pat. No. 9,767,232, which is a
(Continued)

(51) Int. Cl.
| | | |
|---|---|---|
| *G06F 17/50* | (2006.01) | |
| *H04Q 9/00* | (2006.01) | |
| *G01K 1/02* | (2006.01) | |

(52) U.S. Cl.
CPC .......... *G06F 17/5009* (2013.01); *G01K 1/02* (2013.01); *H04Q 9/00* (2013.01); *H04Q 2209/10* (2013.01);
(Continued)

(58) Field of Classification Search
CPC .. G06F 17/5009; G01K 1/02; H04Q 2209/10; H04Q 2209/40; H04Q 2209/823; H04Q 9/00
(Continued)

(56) References Cited

U.S. PATENT DOCUMENTS

| | | |
|---|---|---|
| 3,690,175 A | 9/1972 | Butts |
| 4,003,124 A | 1/1977 | Connick |

(Continued)

OTHER PUBLICATIONS

Non-Final Office Action from U.S. Appl. No. 13/554,877 dated Apr. 9, 2013.
(Continued)

*Primary Examiner* — Hirdepal Singh
(74) *Attorney, Agent, or Firm* — Wolf, Greenfield & Sacks, P.C.

(57) ABSTRACT

An environmental monitoring system including a base station. The base station may receive at least two reports from at least one environmental sensor in an environment; compute, based on values of physical properties of a simulated object and the at least two reports, a simulated condition of the simulated object within the environment; and transmit, to a computing device, the at least two reports and/or the computed simulated condition of the simulated object. A method of operating a base station of an environmental monitoring system. At least one computer-readable storage medium encoded with executable instructions that, when executed by at least one processor, cause the at least one processor to perform a method of operating a base station of an environmental monitoring system.

20 Claims, 12 Drawing Sheets

Related U.S. Application Data continuation-in-part of application No. 14/180,791, filed on Feb. 14, 2014, now Pat. No. 9,500,532.

(60) Provisional application No. 62/367,905, filed on Jul. 28, 2016, provisional application No. 61/933,782, filed on Jan. 30, 2014.

(52) U.S. Cl.
CPC ... *H04Q 2209/40* (2013.01); *H04Q 2209/823* (2013.01)

(58) Field of Classification Search
USPC .......................................................... 340/585
See application file for complete search history.

(56) References Cited

U.S. PATENT DOCUMENTS

| | | | |
|---|---|---|---|
| 4,293,916 A | 10/1981 | Del Re et al. | |
| 4,468,135 A | 8/1984 | McCain et al. | |
| 5,355,686 A | 10/1994 | Weiss | |
| 5,854,994 A | 12/1998 | Canada et al. | |
| 5,892,441 A | 4/1999 | Woolley et al. | |
| 5,982,291 A | 11/1999 | Williams et al. | |
| 6,112,246 A | 8/2000 | Horbal et al. | |
| 6,502,409 B1 | 1/2003 | Gatling et al. | |
| 6,509,830 B1 | 1/2003 | Elliott | |
| 6,553,336 B1 | 4/2003 | Johnson et al. | |
| 6,646,564 B1 | 11/2003 | Azieres et al. | |
| 6,740,033 B1 | 5/2004 | Olejniczak et al. | |
| 6,741,174 B2 | 5/2004 | Rhoades et al. | |
| 6,817,757 B1 | 11/2004 | Wallace | |
| 6,976,368 B1 | 12/2005 | Lamstaes et al. | |
| 7,026,929 B1 | 4/2006 | Wallace | |
| 7,191,097 B1 | 3/2007 | Lee et al. | |
| 7,342,504 B2 | 3/2008 | Crane et al. | |
| 7,456,736 B2 | 11/2008 | Primm et al. | |
| 7,483,805 B2 | 1/2009 | Sparks et al. | |
| 7,688,952 B2 | 3/2010 | Light et al. | |
| 7,822,387 B2 | 10/2010 | Gross | |
| 7,902,975 B2 | 3/2011 | Glenn et al. | |
| 7,952,485 B2 | 5/2011 | Schechter et al. | |
| 8,099,130 B1 | 1/2012 | Halla et al. | |
| 8,181,113 B2 | 5/2012 | Abbott et al. | |
| 8,228,183 B2 | 7/2012 | Glenn et al. | |
| 8,248,252 B2 | 8/2012 | Schechter et al. | |
| 8,353,870 B2 | 1/2013 | Levin et al. | |
| 8,547,226 B2 | 10/2013 | Schechter et al. | |
| 8,599,012 B2 | 12/2013 | Schechter et al. | |
| 8,779,926 B2 | 7/2014 | Schechter | |
| 9,092,967 B2 | 7/2015 | Schechter | |
| 9,372,123 B2 * | 6/2016 | Li | G01K 1/14 |
| 9,500,532 B2 | 11/2016 | Schechter et al. | |
| 9,541,454 B2 | 1/2017 | Schechter et al. | |
| 9,729,945 B2 * | 8/2017 | Schultz | H04Q 9/00 |
| 2001/0044588 A1 | 11/2001 | Mault | |
| 2002/0161624 A1 | 10/2002 | Bradlee | |
| 2004/0090345 A1 | 5/2004 | Hitt | |
| 2004/0226391 A1 | 11/2004 | McNally | |
| 2006/0028335 A1 | 2/2006 | Glenn et al. | |
| 2006/0049961 A1 | 3/2006 | Deck et al. | |
| 2006/0071784 A1 | 4/2006 | Frank | |
| 2006/0087428 A1 | 4/2006 | Wolfe et al. | |
| 2006/0186197 A1 | 8/2006 | Rosenberg | |
| 2006/0202805 A1 | 9/2006 | Schulman et al. | |
| 2006/0218057 A1 | 9/2006 | Fitzpatrick et al. | |
| 2006/0271695 A1 | 11/2006 | Lavian | |
| 2007/0005245 A1 | 1/2007 | Ellis | |
| 2007/0006604 A1 | 1/2007 | Behr | |
| 2007/0139183 A1 | 6/2007 | Kates | |
| 2007/0177439 A1 | 8/2007 | Saito et al. | |
| 2007/0273557 A1 | 11/2007 | Baillot | |
| 2007/0287477 A1 | 12/2007 | Tran | |
| 2008/0048914 A1 | 2/2008 | Smith et al. | |
| 2008/0052044 A1 | 2/2008 | Shoenfeld | |
| 2008/0055158 A1 | 3/2008 | Smith et al. | |
| 2008/0084294 A1 | 4/2008 | Zhiying et al. | |
| 2008/0110391 A1 | 5/2008 | Taylor et al. | |
| 2008/0129465 A1 | 6/2008 | Rao | |
| 2008/0155064 A1 | 6/2008 | Kosuge et al. | |
| 2008/0176539 A1 | 7/2008 | Staton et al. | |
| 2008/0186166 A1 | 8/2008 | Zhou et al. | |
| 2009/0251324 A1 | 10/2009 | Frederick | |
| 2009/0270689 A1 | 10/2009 | Galland | |
| 2009/0273470 A1 | 11/2009 | Sinkevicius et al. | |
| 2009/0278951 A1 | 11/2009 | Loose et al. | |
| 2009/0282715 A1 | 11/2009 | Pemberton | |
| 2009/0283603 A1 | 11/2009 | Peterson et al. | |
| 2010/0052991 A1 | 3/2010 | Smith et al. | |
| 2010/0127880 A1 | 5/2010 | Schechter et al. | |
| 2010/0127881 A1 | 5/2010 | Schechter et al. | |
| 2010/0210919 A1 | 8/2010 | Ariav et al. | |
| 2010/0241277 A1 | 9/2010 | Humphrey | |
| 2010/0312881 A1 | 12/2010 | Davis et al. | |
| 2011/0060571 A1 | 3/2011 | Ueda et al. | |
| 2011/0068929 A1 | 3/2011 | Franz et al. | |
| 2011/0115640 A1 | 5/2011 | Jiang et al. | |
| 2011/0193710 A1 | 8/2011 | McIlvain | |
| 2011/0205033 A1 | 8/2011 | Bandyopadhyay et al. | |
| 2012/0041604 A1 | 2/2012 | Isaksson et al. | |
| 2012/0078723 A1 | 3/2012 | Stewart | |
| 2012/0109449 A1 | 5/2012 | Boehme et al. | |
| 2012/0280834 A1 | 11/2012 | Schechter et al. | |
| 2012/0286969 A1 | 11/2012 | Schechter et al. | |
| 2013/0147630 A1 | 6/2013 | Nakaya et al. | |
| 2013/0169443 A1 | 7/2013 | Schechter | |
| 2013/0282624 A1 | 10/2013 | Schackmuth et al. | |
| 2013/0289927 A1 * | 10/2013 | Smith | G06F 17/18 702/130 |
| 2013/0311140 A1 | 11/2013 | Schechter | |
| 2013/0346125 A1 | 12/2013 | Grant et al. | |
| 2014/0028457 A1 | 1/2014 | Reinpoldt et al. | |
| 2014/0033759 A1 | 2/2014 | Ide et al. | |
| 2014/0053586 A1 | 2/2014 | Poecher et al. | |
| 2014/0107993 A1 | 4/2014 | Cheng | |
| 2014/0149653 A1 * | 5/2014 | Udipi | G11C 7/04 711/106 |
| 2014/0170967 A1 | 6/2014 | Chateau et al. | |
| 2014/0223230 A1 | 8/2014 | Schechter et al. | |
| 2014/0232556 A1 | 8/2014 | Williams | |
| 2014/0278332 A1 | 9/2014 | Grammatikakis et al. | |
| 2014/0029522 A1 | 10/2014 | Schechter | |
| 2014/0375274 A1 | 12/2014 | Tsai et al. | |
| 2015/0015376 A1 | 1/2015 | Jenkins | |
| 2015/0029025 A1 | 1/2015 | Kore et al. | |
| 2015/0032265 A1 * | 1/2015 | Herring | F24F 11/30 700/276 |
| 2015/0067153 A1 | 3/2015 | Bhattacharyya et al. | |
| 2015/0120336 A1 | 4/2015 | Grokop et al. | |
| 2015/0120586 A1 | 4/2015 | Schechter | |
| 2015/0123810 A1 | 5/2015 | Hernandez-Rosas et al. | |
| 2015/0123811 A1 | 5/2015 | Hernandez-Rosas et al. | |
| 2015/0123812 A1 | 5/2015 | Hernandez-Rosas et al. | |
| 2015/0192475 A1 * | 7/2015 | Eisenstadt | G01K 1/02 340/870.17 |
| 2015/0199471 A1 | 7/2015 | Thorsteinsson | |
| 2015/0213162 A1 | 7/2015 | Schechter et al. | |
| 2015/0316942 A1 | 11/2015 | Schechter | |
| 2015/0355036 A1 | 12/2015 | Giorgi et al. | |
| 2015/0369671 A1 | 12/2015 | Schechter et al. | |
| 2016/0202673 A1 * | 7/2016 | Ehtemam-Haghighi | G06F 1/3287 700/275 |
| 2016/0261458 A1 * | 9/2016 | Huang | H04L 43/16 |
| 2016/0357892 A1 | 12/2016 | Schechter et al. | |
| 2018/0188733 A1 * | 7/2018 | Iandola et al. | |

OTHER PUBLICATIONS

[No Author Listed] Cryolog, Traceo product literature, http://www.cryolog.com/en/pages/products_and_services/traceo/index.php, 2007. Last accessed Oct. 23, 2008, 1 page.

(56) References Cited

OTHER PUBLICATIONS

[No Author Listed] EasyLog USB Data Logger product literature, http://www.lascarelectronics.com/temperaturedatalogger.php?datalogger=102, Last accessed Oct. 23, 2008, 1 page.
[No Author Listed] http://www.bapihvac.com/CatalogPDFs/1 App Notes/Thermal Buffer Temp Sensing.pdf, Rev. Mar. 3, 2008. Last accessed May 1, 2014, 1 page.
[No Author Listed] http://www.fishersci.com/ecomm/servlet/itemdetail?catnum=NC0278993&storeid=10652, copyright 2014, Last accessed May 1, 2014, 1 page.
[No Author Listed] http://www.kele.com/temperature-sensors-and-transmitters/as10-series.aspx, Last accessed May 1, 2014, 2 pages.
[No Author Listed] http://www.prweb.com/releases/refrigeration/efficiency/prweb10684359.htm, Last accessed May 1, 2014, 2 pages.
[No Author Listed] http://www.temprotect.com/action/shop/viewitem/?itemType=72&name=Glycol%20Buffer%20Vial. Last accessed Jul. 9, 2014, 2 pages.
[No Author Listed] http://www.thermcoproductsinc.com/vaccine-thermometers.html, Last accessed May 1, 2014, 4 pages.
[No Author Listed] http://www.vfcdataloggers.com/probevial-1.aspx, Copyright 2014 Dataloggers, Last accessed May 1, 2014, 2 pages.
[No Author Listed] iButtonLink Temperature Monitor product literature, http://www.ibuttonlink.com/1-wire-interface-masters.aspx, Last accessed Oct. 23, 2008, 2 pages.
[No Author Listed] IT Watchdogs WeatherDuck product literature, http://www.itwatchdogs.com/duckdetails.shtml, 2002-2005, Last accessed Oct. 23, 2008, 1 page.
[No Author Listed] THUM—Temperature Humidity USB Monitor product literature, Practical Design Group, LLC, http://practsol.com/thum.htm, 2004-2008, Last accessed Oct. 23, 2008, 3 pages.
[No Author Listed] USB Tenki: USB Temperature sensors and more product literature, http://www.raphnet.net/electronique/usbtenki/index_en.php, pp. 1-8, 2002-2008, Last accessed Oct. 23, 2008, 8 pages.
[No Author Listed] WiFi Vaccine Temperature Data Logger http://www.dicksondata.com/products/WFT21 Last accessed May 1, 2014, 3 pages.
[No Author Listed] ZigBee—Wikipedia, the free encyclopedia. available at http://en.wikipedia.org/wiki/Zigbee, Last accessed Dec. 23, 2011, 12 pages.
Abbasi et al., "A survey on clustering algorithms for wireless sensor networks," Computer Communications 30, published 2007;2826-41.
Savvides et al., "The Bits and Flops of the N-hop Multilateration Primitive for Node Localization Problems," WSNA'02, Sep. 28, 2002, Atlanta, Georgia. 10 pages.
Sugano et al., "Indoor Localization System Using RSSI Measurement of Wireless Sensor network Based on Zigbee Standard", Wireless and Optical Communications, 2006, pp. 1-6.
Younis et al., "Distributed Clustering in Ad-hoc Sensor Networks: A Hybrid, Energy-Efficient Approach," In Proceedings of IEEE INFOCOM, vol. 1, pp. 1-12, Mar. 2004.
Zanca et al., "Experimental comparison of RSSI-based localization algorithms for indoor wireless sensor networks," REALWSN'08, Apr. 1, 2008, p. 1-5. Glasgow, United Kingdom.
Zhao et al., "Wireless Sensor Networks, An Information Processing Approach," Morgan Kaufmann Publishers, 2004, 24 pages.

\* cited by examiner

| Variable | Unit | Symbol |
|---|---|---|
| Convection Coefficient | W/(m²·K) | $h$ |
| Surface Area | m² | $A_s$ |
| Mass | Kg | $m$ |
| Specific Heat | J/(Kg·K) | $c_p$ |
| Time Interval | s | $t_{int}$ |
| Temperature (measured) | °C | $T_{prev}$ |
| | | $T_{new}$ |

FIG. 7

TEMPERATURE MONITORING WITH SIMULATED THERMAL BUFFER COMPUTED AT A BASE STATION

CROSS-REFERENCE TO RELATED APPLICATIONS

This application claims the benefit under 35 U.S.C. § 120 of U.S. application Ser. No. 15/241,696, entitled "TEMPERATURE MONITORING WITH SIMULATED THERMAL BUFFER COMPUTED AT A BASE STATION" filed on Aug. 19, 2016, which claims priority under 35 U.S.C. § 119(e) to U.S. Provisional Application Ser. No. 62/367,905, entitled "TEMPERATURE MONITORING WITH SIMULATED THERMAL BUFFER COMPUTED AT A BASE STATION" filed on Jul. 28, 2016 and claims the benefit under 35 U.S.C. § 120 of U.S. application Ser. No. 14/180,791, entitled "TEMPERATURE MONITORING WITH SIMULATED THERMAL BUFFER" filed on Feb. 14, 2014, which claims priority under 35 U.S.C. § 119(e) to U.S. Provisional Application Ser. No. 61/933,782, entitled "TEMPERATURE MONITORING WITH SIMULATED THERMAL BUFFER" filed on Jan. 30, 2014, each of which is herein incorporated by reference in its entirety.

BACKGROUND

Temperature monitoring is used in many industries. For example, restaurants and food processing companies that rely on refrigeration equipment to keep their products fresh frequently use temperature monitoring. If a malfunction of the refrigeration equipment is not detected promptly, food could and does get either too hot or too cold, resulting in damage to the food products. For a business that relies on food, such damage could result in a large monetary loss and potentially a serious business disruption.

As another example, companies that operate servers or other computer equipment may also monitor temperature of their equipment. Sometimes, a malfunctioning component of the computer equipment will generate excessive heat. Thus, a temperature increase may indicate a defect that may need to be corrected. Also, excessive heat generated by the equipment may cause components to fail because they are operating beyond their proper operating temperatures.

Temperature monitoring systems are known. These systems incorporate temperature sensors attached to or mounted near equipment for which temperature is to be monitored. The system responds if the temperature sensor indicates a temperature outside of a normal operating range. One type of response that has been used is to raise an alarm at a facility where the monitored equipment is located. Some systems use bells, flashing lights, or other forms of audible or visible indications of an improper operating temperature.

SUMMARY

Some embodiments provide an environmental monitoring system. The environmental monitoring system may include a base station configured to: receive at least two reports from at least one environmental sensor in an environment; compute, based on values of physical properties of a simulated object and the at least two reports, a simulated condition of the simulated object within the environment; and transmit, to a computing device, the at least two reports and the computed simulated condition of the simulated object.

In some embodiments, there is provided a method of operating a base station of an environmental monitoring system. The method may comprise: receiving a plurality of reports from at least one environmental sensor in an environment; computing, based on values of physical properties of a simulated object and the plurality of reports, a simulated condition of the simulated object within the environment; and transmitting, to a server, at least two of the plurality of reports and the computed simulated condition of the simulated object.

Further embodiments provide at least one computer-readable storage medium encoded with executable instructions that, when executed by at least one processor, cause the at least one processor to perform a method of operating a base station of an environmental monitoring system. The method may comprise: receiving a plurality of reports from at least one environmental sensor in an environment; computing, based on values of physical properties of a simulated object and the plurality of reports, a simulated condition of the simulated object within the environment; and transmitting, to a server, at least two of the plurality of reports and the computed simulated condition of the simulated object.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 7 is a table illustrating the fields of an exemplary database that may be used with some embodiments.

DETAILED DESCRIPTION

Figure 1A:
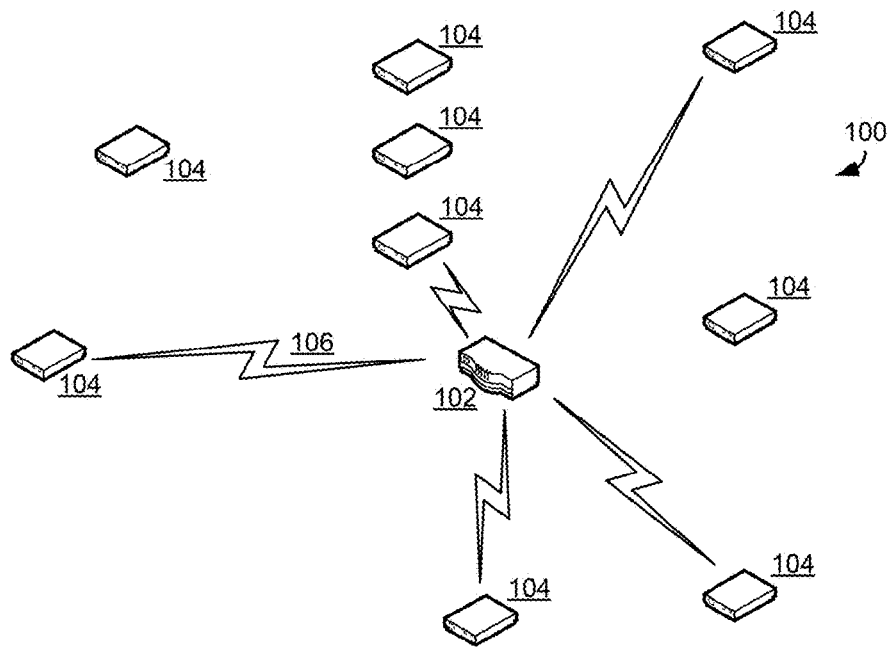
FIGS. 1A and 1B are illustrations of an exemplary environmental sensor network that may be used in an environment.

The inventors have recognized and appreciated that an environmental monitoring system may be more valuable with a base station that has a capability to simulate a condition of an object within the environment based on measured environmental conditions. The base station may transmit the computed simulated conditions to a server instead of or in addition to reports of measured conditions in the environment received from sensors. The system may output information about the monitored environment based on a comparison of the simulated condition to a threshold or other criteria. Such an approach enables environmental sensors to be simply and easily deployed.

In some scenarios, monitoring the temperature within an object, or other characteristic influenced by environment conditions, may be important. In accordance with some embodiments described herein, rather than developing a sensor to measure conditions within an object, a simple and easily deployed sensor may be used to provide information indicative of a condition within an object. The function of those sensors may be tailored by configuring data processing equipment to simulate the response of an object to environmental conditions. The simple and easily deployed sensors may measure the environmental conditions, and the system may, using the simulation, compute the characteristic within an object.

In some embodiments, the environment may be a refrigerator, processing oven, or other temperature controlled environment. The characteristic of interest may be temperature. One or more temperature sensors may be deployed in the environment. A data processing system, receiving and processing readings from the temperature sensors, may compute the internal temperature of a simulated object within the environment. That simulated temperature may be compared to temperature/condition alarm limits of a product that might be stored in that environment.

As a specific example, the refrigerator may be intended to store vials of medicine at a controlled temperature. The simulated object may represent a vial of fluid, which may be characteristic of the medicine. The data processing system may be configured with values of physical properties that characterize the simulated vial. As sensor readings are provided to the data processing system, these properties may be used to compute a condition, such as the temperature of the liquid, in the simulated vial. This temperature may be compared to alarm limits indicating whether the fluid within the vial has become hotter or colder than specifications for the medicine.

Solutions for monitoring conditions of a product traditionally have involved measuring environmental conditions of physical objects. Measurements might be made on an object of interest or on a substitute physical object of approximately the same size and made with materials of similar thermal characteristics. Such objects might be more readily instrumented with a sensor than the actual object, but would respond to environmental conditions in a similar fashion.

The inventors have recognized and appreciated that, even when these substitute physical objects are used, there are several disadvantages. Users may store a variety of products in different sized containers, and each product may have unique thermal properties, while substitute physical objects may generally be available in limited sizes and may not be representative of the range of products stored by users. For example, if user A is storing a vaccine in a 10 milliliter (mL) vial and user B is storing beer in a 56,000 mL keg, one physical object may not be representative of both users' products to an acceptable accuracy.

The inventors have recognized and appreciated the advantages of an environmental monitoring system with a virtual thermal buffer that uses the thermal properties of a product to simulate environmental conditions of the product. Such a virtual thermal buffer may be adjusted to represent or match a user's specific product. In the example described above, a simulated object may be adjusted to represent or match user A's 10 mL vial of vaccine or user B's 56,000 mL keg of beer, each to an acceptable accuracy. In accordance with some embodiments, such adjustments may be made by providing configuration inputs into a computing system or in any other suitable way.

Moreover, simulating a response of an object to environmental conditions avoids the need to develop a sensor that is embedded within an object. Making a sensor that mounts in a dry location, for example, may be simpler and less expensive than manufacturing a sensor adapted for insertion in a vial or other fluid.

Such an approach may be applied in connection with an environmental monitoring system that monitors environmental conditions in multiple locations for multiple users. Each user may use the same type of sensor configured to communicate with a data processing device, such as a server. Each user may specify, such as by providing data through a server website, values of physical properties of a simulated object. Each user may also specify alarm limits associated with conditions of the simulated object. The data processing device may process sensor measurements received from an environment operated by a user, compute a condition of the simulated object, as specified by that user, and compare a computed condition of the simulated object to alarm limits provided by that user. The system may conditionally take an action, based on the result of that comparison. The action taken by the system, such as sending a message, may also be configured by that user.

Described herein are techniques for computing, using a computing device, a simulated condition of a simulated object within an environment based on values of physical properties of the simulated object and at least one report from at least one environmental sensor in the environment; comparing the simulated condition to a criterion; and selectively outputting an indication of an alarm condition based on the comparing. In some embodiments, the simulated condition of the simulated object may be a simulated temperature, air quality, moisture level(s), or any other suitable condition. The at least one report may be multiple instances of a measured temperature, air quality, moisture level(s), and/or any other condition. The simulated object may be a fluid, a solid, a gas, or any other suitable type or state of matter. It may be a medical product (e.g., a vaccine) or food product (e.g., beer) or anything else that is suitable. The simulated object may react in various different ways to changes in the air or other conditions or to any other suitable occurrence or state.

The environment may be any type of location, including the many described throughout this specification. The physical properties may be the convection coefficient, surface area, mass, and/or specific heat of the simulated object, or any other suitable property. The criterion may be limits on temperature or other condition provided by a user or otherwise known by a system to act as alarm limits. For example, if a medical product will only be usable if kept within a certain temperature range, but it is stored in a refrigeration unit in which the temperature is often or always changing (due to door movement or compressor cycling), the user may set as alarm limits the boundaries of that temperature range. According to some embodiments, the system or servers may output an indication of an alarm condition to the user, to an interface the user may view or operate, or in any other suitable way if the simulated temperature of a simulated object simulating the medical product goes beyond the alarm limits. The indication of the alarm condition may be data transmitted to be displayed in the user interface or directly to the user in a message such as one via Short Message Service (SMS). It may trigger an audible or visual alarm on a device or trigger another operation that can signal that a condition in the monitored environment has passed the alarm limit.

In some embodiments, an environmental monitoring system may comprise one or more sensor units disposed in an environment and one or more servers. The environment in which the sensors are disposed may be managed by a user. The servers may receive from the user an input of the values of the physical properties of the simulated object. In such an environment, the user may provide input through a user interface of a computing device that is coupled to the server over a network, such as the Internet.

Any suitable user interface may be used. For example, the input may be direct input of the values or selection of the values from a list. The input may be a selection of the simulated object with some predetermined values of the physical properties (e.g., 60 mL of propylene glycol). The input may be associated with an account based on credentials issued to the user for the account. The account may be an account created in person or over the Internet or telephone or through any other means. The credentials may be a username and password, a personal identification number, a one-time-use code, or any combination thereof or any other suitable credentials.

The inventors have recognized and appreciated the advantages of computing the condition of the simulated object on the same device that first receives report(s) from environmental sensor(s). For example, the device may serve as an intermediary between the environmental sensors and the server, such as a base station. Such a base station may typically relay reports to the server or another remote device via a connection that is not always functioning or available, such as a cellular connection, or the server or remote device may not always be reachable for other reasons. If the computation of the condition of the simulated object occurs on the server, the base station may need to temporarily store reports and/or other information while the connection or the server itself is somehow unavailable and then send the reports when the server can be reached again.

In accordance with some embodiments, processing of the simulated conditions may be performed on the server for a single base station or multiple base stations, such as where the server is part of system providing environmental monitoring services to multiple clients. The server may then communicate effectively with multiple clients based on a comparison of the simulated conditions to thresholds or other criteria established for each client. However, computing the simulated conditions on the base stations may avoid problems associated with loss of reports of measured environmental conditions during communication between the base station and the server.

The inventors have recognized and appreciated that computation of simulated environmental conditions may be stateful, such that the order in which reports are processed and/or which reports are processed may impact the accuracy of the simulated value. As computing the simulated condition on the base station entails less risk that reports will be lost or out of order than performing the same computation on a server connected to the base station via a communications network, greater accuracy is achieved with the computation of simulated conditions on the base station.

The impact of loss or reordering of reports in communication between a base station may be significant in embodiments in which a base station buffers data before transmitting it to the server. The base station, for example may buffer data and transmit it to a server when channel conditions permit. The base station, in some embodiments, may transmit most recently obtained data before less recently obtained data in the buffer. The inventors have recognized and appreciated that it may be advantageous for the base station to store reports differently and in different places based on certain criteria. For example, the base station may store each new report in a stack in random access memory (RAM). When the stack is at a threshold capacity, the base station may begin transferring the oldest report from the stack in RAM to a circular buffer in Flash memory as each new report arrives for storage in the stack in RAM. The base station may also free space on the stack by transmitting a report to the server, when transmission is possible.

When the circular buffer is at threshold capacity, the base station may erase the oldest report from the circular buffer as each report is transferred from the stack in RAM. The inventors have recognized and appreciated that because RAM is faster and generally has less capacity than Flash memory, it may be advantageous for the base station to operate using RAM whenever possible and for the most recent reports and to use Flash memory as needed and when it has time.

Because the most recent reports on the environment are typically the most important, those may be transmitted first to the server. The inventors have recognized and appreciated, however, that doing so results in reports that arrive at the server out of order, which may result in an erroneous calculation of the condition of the simulated object. The server may thus need to recalculate the condition of the simulated object. This need for recalculation may prevent the environmental monitoring system from being as responsive as desired and may delay alerts that it might generate. For example, by the time a user is made aware of any potential problem in the environment, it may be too late to respond appropriately (e.g., to prevent a stored product from spoiling).

The inventors have recognized and appreciated that this recalculation may be avoided by performing calculation of the condition of the simulated object at the base station. This way, the same device that first receives the reports (the so-called intermediary device) may use the reports as they are meant to be used without risking delay from the server not being reachable. Alternatively or additionally, the base station may transmit the calculated condition of the simulated object to a local device for display to a user.

The inventors have recognized and appreciated that it may be advantageous to transmit the calculated condition of the simulated object from the base station to the server along with the reports used to perform the calculation. This may allow the server to validate the calculation performed by the base station. Because the server may be remote and managed directly by a vendor of the environmental monitoring system, the server may be more reliable and algorithmically up-to-date in calculating the condition of the simulated object, and so it may provide valuable verification or correction of the calculation.

The inventors have also recognized and appreciated that it may also be advantageous to be able to activate and deactivate the base station's calculation of the condition of the simulated object. For example, if the base station is using outdated firmware that can no longer perform the calculation appropriately, the server may transmit a command to the base station to deactivate local calculation of the condition and rely on the server for the calculation. On the other hand, if the server is overloaded, the server may transmit a command to the base station to activate or re-activate the local calculation. Though, it should be appreciated that the server may transmit commands to the base station for other reasons, including to ensure that data is received at the server to compare to monitoring criteria for an environment being monitored.

According to some embodiments, computing the simulated condition of the simulated object may include selecting a type of model for the simulated object that may be based on characteristics of the object being simulated. The selection may be based on values of one or more parameters supplied for an environment being monitored. The selection may, for example, be made based on information input by a user into the server. The server may communicate the selection to the base station in any suitable way, including as an instruction to compute simulated conditions with a specific program previously stored on the base station or by sending commands that cause the base station to receive a program that executes according to the desired model, or by sending values or parameters used by a program executing on the base station.

For example, a method of monitoring as described herein may include selecting a model of the simulated object such that the simulated object behaves isothermally or transiently (that is, whether it may be simulated using an isothermal or a transient model, respectively). An effectively isothermal object's temperature at its edge may be practically the same as the temperature at its center, whereas an effectively transient object temperature may have a more noticeable difference (a gradient) between the temperature at its edge and the temperature at its center than an effectively isothermal object.

If the simulated object is to behave transiently, the transient response may be influenced by selection of a model with a desired transient response. The model may be selected in any suitable way. In some embodiments, for example, a user may designate a model from a predefined model library. Such a selection may be based on user input directly specifying a model in the library or by the user specifying the object, or characteristics of the object, to be simulated. Alternatively, the user may input an equation representing the transient response to be modeled.

In some embodiments, the appropriate model may be determined from values of physical properties of the simulated object. Such values may be input by a user, either directly or indirectly by specifying characteristics of the simulated object that the system may convert to values of physical properties. As a specific example, values of physical properties may be used to calculate a number, which may be a ratio of values of properties of the simulated object, such as a Biot number:

$$Bi = \frac{hA_s}{kV} \quad \text{(Equation 1)}$$

where $A_s$ may be the surface area of the simulated object, V may be its volume, k may be its conduction coefficient, and h may be its convection coefficient. Values of any or all of these parameters may be predetermined, input directly by a user, or derived in some other way, such as by lookup in a material property table based on a material specified by a user. In some embodiments, if the Biot number is equal to or less than 0.1, then the product may be simulated using an isothermal model. Otherwise, a transient model may be used.

For some embodiments, FIG. 7 illustrates variables that may be applied to an equation to generate an isothermal model to calculate the simulated temperature of the simulated object. An equation that may be used to make such a calculation may be as follows (first computation method or model):

$$\text{Simulated Temperature} = e^{-\frac{hA_s}{mc_p}t_{int}} \cdot (T_{prev} - T_{new}) + T_{new} \quad \text{(Equation 2)}$$

where m may be the mass of the simulated object, $c_p$ may be its specific heat, $t_{int}$ may be the time between temperature samples, $T_{prev}$ may be a first measured temperature of the air, and $T_{new}$ may be a second measured temperature of the air, which may be measured at $t_{int}$ after the first measured temperature is measured. In other words, the system or servers may use multiple instances of air temperature measurements to calculate the simulated temperature of the simulated object. A first air temperature measurement may be assigned the variable $T_{prev}$. When the next air temperature reading is taken, it may be assigned the variable $T_{new}$. These two temperature readings, along with the other listed variables, may be used to solve for the simulated temperature of the simulated object. When a new air temperature measurement is taken, it may replace the current $T_{new}$, and the previously calculated simulated temperature may become $T_{prev}$.

If the simulated object does not behave isothermally, computing the simulated condition of the simulated object may involve using a second computation method or model. The second model may use a different equation in which a value representing a temperature is calculated using an equation that linearly combines values of parameters, such as convection coefficient, surface area, mass, and specific heat.

The techniques described herein may be implemented in any suitable manner. Described below are exemplary implementations of these techniques, though these examples are merely illustrative of the various ways in which embodiments may operate. It should be appreciated that embodiments are not limited to operating in accordance with these examples.

In some examples below, an environmental monitoring system is described that monitors a temperature of an environment. It should be appreciated, however, that embodiments may monitor any suitable conditions of an environment and that embodiments may monitor other conditions in addition to or instead of monitoring temperature, as described above. A condition of an environment may include any suitable characteristic of the environment that may be monitored, such as meteorological characteristic of the environment. An environment could be any suitable area including liquids, gases, and/or solids that may be inside a building and/or outside a building. The conditions of any liquids, gases, or solids of the environment can be monitored as conditions of the environment. Temperature, air quality, and moisture levels are examples of environmental conditions that may be monitored.

Further, in some examples below, an environmental monitoring system is described that is disposed in an environment that includes the interior of a building. It should be appreciated, however, that embodiments are not limited to operating in any particular environments and that environmental monitoring systems may be implemented that monitor conditions in environments that are indoors, outdoors, or a combination of indoors and outdoors.

Exemplary environmental sensor networks and exemplary environmental monitoring systems are described below in connection with FIGS. 1A, 1B, and 2. However, it should be appreciated that embodiments are not limited to operating with any specific sensor units, sensor networks, or monitoring systems. In some embodiments, the sensor units and monitoring systems may be implemented in accordance with the sensor units and monitoring systems disclosed in U.S. Pat. No. 7,952,485, titled "Remote Monitoring System" and filed on Nov. 21, 2008, and disclosed in U.S. Patent App. Publication No. 2010/0127881, titled "Remote Monitoring System" and filed on Nov. 21, 2008, each of which is hereby incorporated by reference in their entirety and at least for their discussion of sensor units and monitoring systems.

Figure 1B:
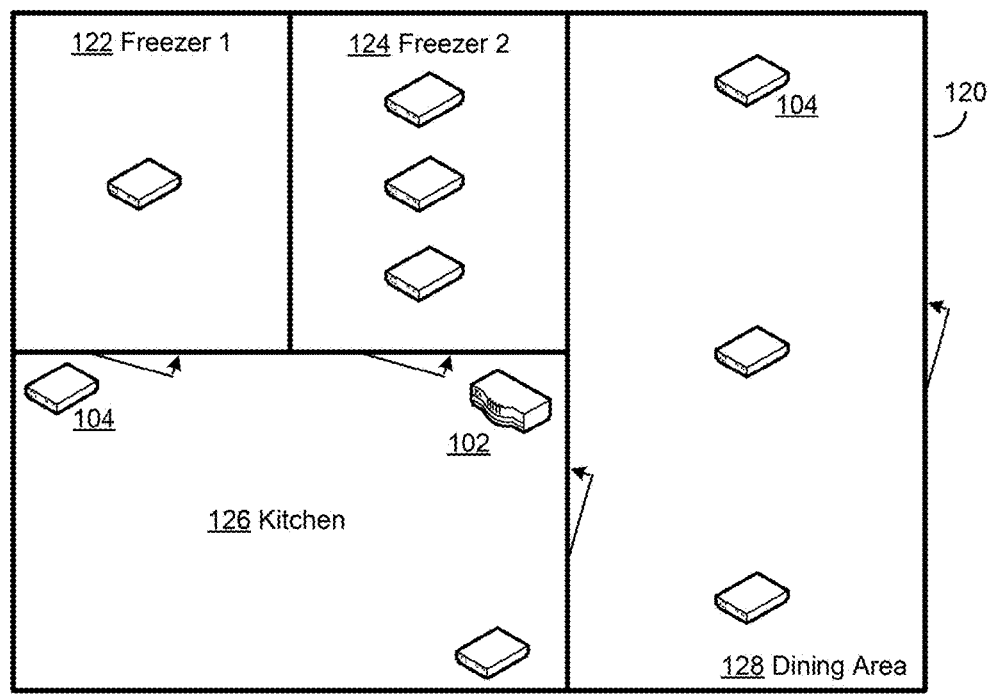

FIG. 1A illustrates an example of an environmental sensor network of an environmental monitoring system with which some embodiments may operate. An environmental sensor network collects data regarding at least one condition of an environment in which the environmental sensor network is located. The environmental sensor network 100 of FIG. 1A includes at least one base station 102 and multiple sensor units 104 that monitor and collect data regarding at least one condition of an environment in which the network 100 is disposed. The base station 102 is capable of communicating wirelessly, via a wireless signal 106, with each of the sensor units 104, and acts as a relay device to communicate information about and from the sensor units 104 to other computing devices outside the environment using a wired and/or wireless communication medium. The base station 102 may be any suitable computing device, including a device that is dedicated to wirelessly relaying information received from sensor units 104 or a device that is capable of wirelessly relaying information received from sensor units 104. In some embodiments, for example, the base station 102 may be a cellular telephone and may be able to make telephone calls, send/receive text messages, and relay information received from sensor units 104 via a wireless cellular communication channel.

The base station 102 may communicate wirelessly with the sensor units 104 in any suitable manner, such as via a low-power wireless communication protocol that has limited range. A low-power protocol with limited range may not transmit information outside the environment in which the network 100 is disposed. Examples of such low-power protocols include Wireless Personal Area Network (WPAN) protocols and Wireless Local Area Network (WLAN) protocols. Examples of WPAN protocols that may be used in embodiments include the BLUETOOTH™ and ZIGBEE® protocols, though any suitable WPAN protocol may be used. Examples of WLAN protocols that may be used in embodiments include any protocols of the Institute of Electrical and Electronics Engineers (IEEE) 802.11 protocol suite, though any suitable WLAN protocol may be used. It should be appreciated, though, that embodiments that use a low-power protocol to communicate between the base station 102 and sensor units 104 are not limited to using WPAN or WLAN protocols, or any of the examples of such protocols mentioned above, but rather may use any suitable low-power protocol, as embodiments are not limited in this respect.

Any suitable information may be communicated between the base station 102 and the sensor units 104. For example, the sensor units 104 may communicate to the base station 102 information regarding one or more environmental conditions being monitored. Where information regarding environmental conditions is transmitted, any suitable information may be transmitted in any suitable format, as embodiments are not limited in this respect. In some embodiments, the sensor units 104 may collect data regarding a condition and send that data as the information transmitted to the base station 102, while in other embodiments the sensor units 104 may process collected data in some manner and transmit results of the processing as information regarding a condition to the base station 102.

While the exemplary environmental sensor network 100 of FIG. 1A includes a base station 102 for relaying information from the sensor units 104 to devices outside the sensor network and outside the environment, embodiments are not limited to operating with base stations. In other embodiments, each of the sensor units 104 may include components for communicating information to devices outside of the network and outside of the environment and the sensor network. In some of the embodiments where sensor units are able to communicate outside the sensor network and outside the environment, the environmental sensor network may not include a base station, though in other embodiments one or more base stations may be provided in the sensor network. An environmental sensor network of the type illustrated in FIG. 1A may be used in any suitable environment to monitor conditions of the environment. FIG. 1B illustrates the network 100 disposed in environment 120 that is a restaurant. The environment 120 includes freezers 122, 124, a kitchen 126, and a dining area 120 and the sensor units 104 of the network 100 are disposed in various locations in the environment 120 to monitor conditions at multiple locations of the environment. In the restaurant context, environmental conditions such as temperature can be important to monitor, particularly in connection with the freezers 122, 124 as the freezers 122, 124 may store supplies for the restaurant that might spoil if the temperature in the freezers 122, 124 strays outside acceptable operating ranges. To monitor temperature in the freezers, one sensor unit (in the case of freezer 122) or multiple sensor units (in the case of freezer 124) that are adapted to monitor temperature may be placed within the freezers 122, 124 and may collect data regarding the temperature. Information regarding the temperature may then be communicated from the sensor units to the base station 102 via a wireless signal. Other sensor units at other locations in the environment 120 may also collect data regarding environmental conditions in the rooms of the restaurant in which the sensor units are located and provide that information to the base station 102.

The base station 102 may take any suitable actions in response to receiving information on conditions of the environment from the sensor units 104. In some embodiments, the base station 102 may store the received information in a data store of the base station 102, such as a database that is maintained as a component of the base station 102. Additionally or alternatively, the base station 102 may transmit the information to a remote data store via a communication network using a connection-oriented or connectionless communication protocol. The remote data store to which the information is transmitted, which may be outside the environment in which the sensor network 100 is disposed, may be associated with the environmental sensor network 100, in that the remote data store may form, together with the sensor network 100, a part of an environmental monitoring system.

Figure 1C:
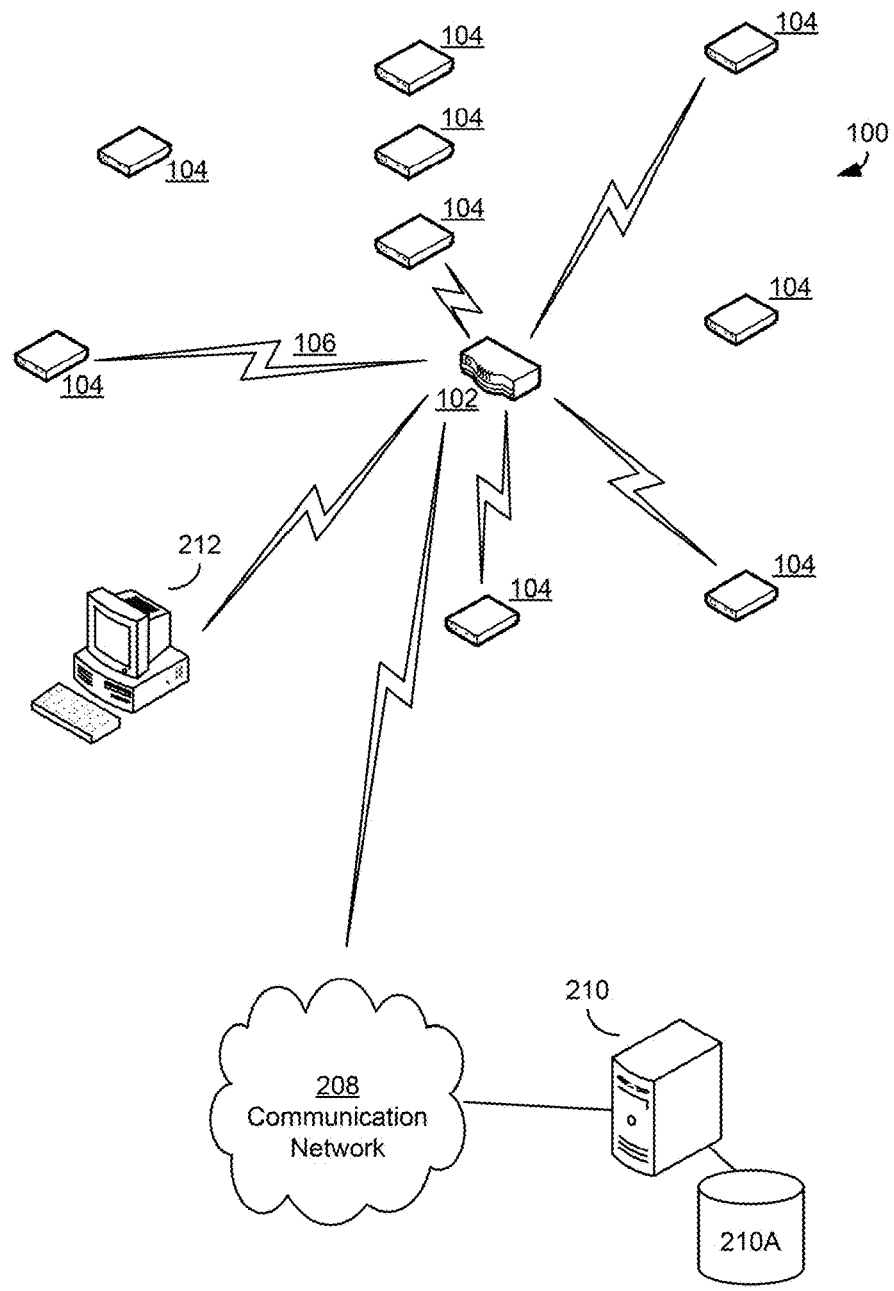
FIG. 1C is an illustration of an exemplary environmental sensor network connected to a computing device, a communication network, and a server, in accordance with some embodiments.

FIG. 1C illustrates an exemplary environmental sensor network connected to a computing device, a communication network, and a server, in accordance with some embodiments. As shown in FIG. 1C, the environmental sensor network 100 may, according to some embodiments, be connected to one or more servers 210 that are associated with a data store 210A. The environmental sensor network 100 may provide to the server(s) 210 and the data store 210A, via at least one communication network 208, information that is communicated between sensor units and base stations, as discussed further below with regards to FIG. 2. The transmission may be carried out in any suitable manner, such as a high-power wireless communication protocol that is capable of transmitting information outside of the environment in which the environmental sensor network 100 is disposed.

Figure 1D:
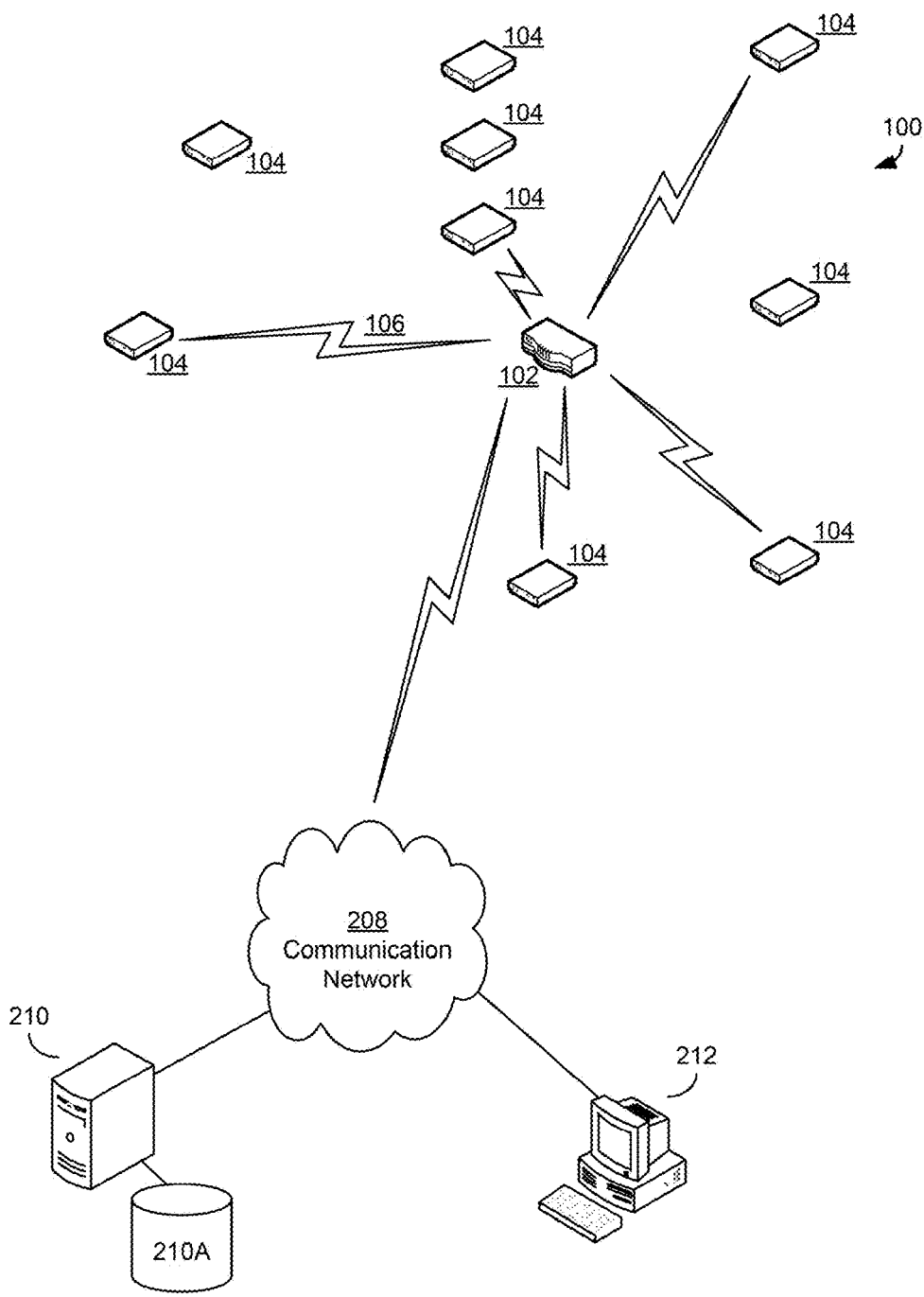
FIG. 1D is an illustration of an exemplary environmental sensor network connected to a computing device and a server via a communication network, in accordance with some embodiments.

According to some embodiments, the environmental sensor network 100 may be connected to a computing device 212, which may perform functions of the server 210 described herein and/or present a user interface to a user, which is described further below. The computing device 212 may communicate directly with the base station 102, as shown in FIG. 1C. Alternatively, the computing device 212 may communicate with the base station 102 via the communication network 208, as shown in FIG. 1D. Alternatively or additionally, computing device 212 may serve as a user interface to server 210. In such an embodiment, server 210 may communicate with base station 102 based on input received through computing device 212.

According to some embodiments, the user interface may display information like that stored in the data store 210A. The user may thereby view the information regarding conditions of the environment 120 and take any suitable action based on the information. Upon viewing the information regarding the conditions of the environment, the user may perform various management operations based on the information, such as adjusting climate control of a room being monitored or other actions. Embodiments are not limited to working with users that take any particular action based on information presented via the user interface.

Figure 1E:
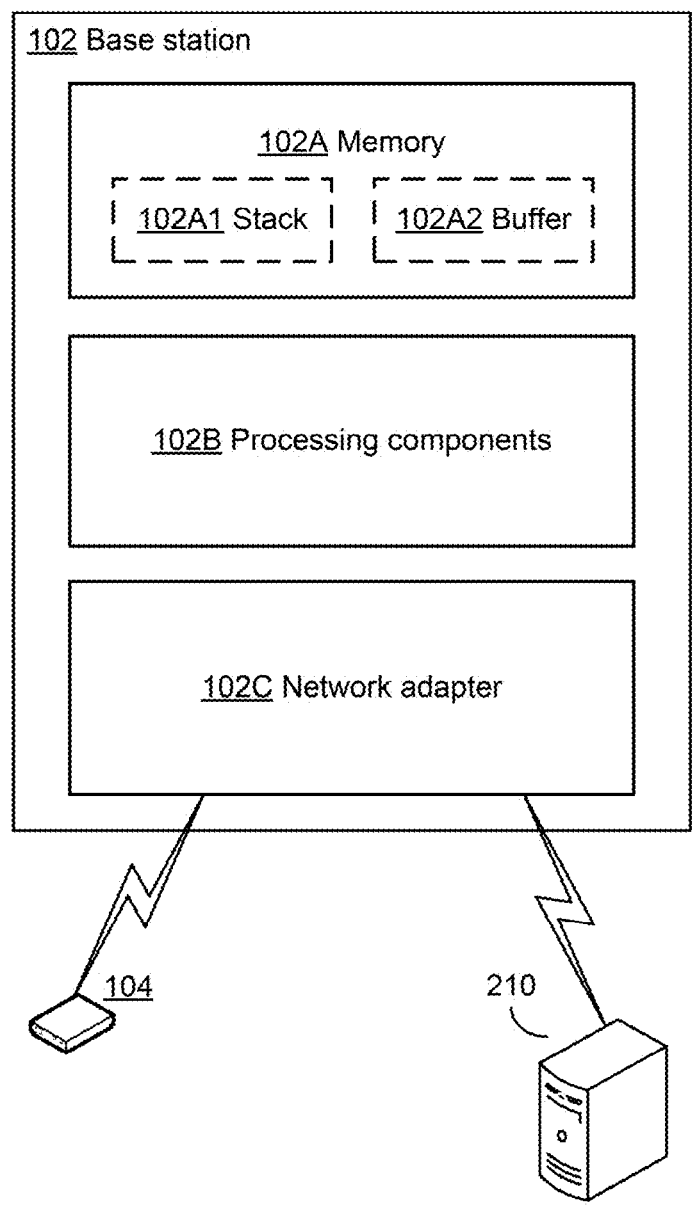
FIG. 1E is a block diagram of an exemplary base station with which some embodiments may operate.

FIG. 1E is a block diagram of an exemplary base station with which some embodiments may operate. According to some embodiments, a base station 102 may receive two or more reports from one or more environmental sensors 104 in an environment (such as environment 120). Additionally, base station 102 may compute, based on values of physical properties of a simulated object and the at least two reports, a simulated condition of the simulated object within the environment. Furthermore, base station 102 may transmit, to server 210 and/or computing device 212 (not shown), the at least two reports and the computed simulated condition of the simulated object. In accordance with some embodiments, a stream of reports may be received from the one or more sensors. These reports may be used to compute conditions of the simulated object. In accordance with some embodiments, a stream of simulated conditions may be computed from the stream of reports. In some embodiments, the stream of simulated conditions may be computed in real time, as new reports from sensors are received. In some embodiments, computed simulated conditions may be stored along with reports. However, it should be appreciated that, in some embodiments, a stream of reports and a stream of computed simulated conditions may contain redundant information and only portions of one stream may be saved.

According to some embodiments, base station 102 may be located in the environment, as shown in FIGS. 1A-1E. Alternatively, base station 102 may be in a location different from the environment (not shown).

According to some embodiments, base station 102 may include one or more memories 102A for storing reports and other information described herein, such as programs for computing the simulated condition of the simulated object and/or the simulated conditions. Memories 102A may include a stack in a first memory 102A1 and a buffer (e.g., a circular buffer) in a second memory 102A2. Additionally, the first memory 102A1 may be RAM, and the second memory 102A2 may be Flash memory or another type of memory with a lower data processing rate than the first memory 102A1 and a higher data capacity than the first memory 102A1, as discussed above. According to some embodiments, the reports stored in the first memory 102A1 may be more recent than the reports stored in the second memory 102A2, as discussed above.

According to some embodiments, base station 102 may also include processing components 102B for computing the simulated condition or any other necessary processing. For example, processing components 102B may execute programs stored in memories 102A. Additionally, base station 102 may include network adapter 102C for communicating with environmental sensors 104, server 210, computing device 212, or any other devices. In some embodiments, networks adapter 102C may control transmission from the first memory 102A1 and/or the second memory 103B to the server 210 and/or computing device 212 based on detection of a connection to either.

According to some embodiments, the server 210 or computing device 212 may receive, from base station 102, the computed simulated condition of the simulated object with or without the reports of environmental conditions from which the simulated conditions were computed. Two or more of these values, such as a stream of such values, may be received. Additionally, server 210 or computing device 212 may compare the simulated condition to a criterion. For example, the simulated condition may be a temperature of a simulated vial of a drug, and the criterion may be a maximum allowable temperature of the drug. Furthermore, server 210 and/or computing device 212 may selectively output an indication of an alarm condition based on the comparing. For example, if the computed temperature is higher than the maximum allowable temperature, server 210 and/or computing device 212 may send or display an alarm to the user.

According to some embodiments, server 210 or computing device 212 may verify the computed simulated condition of the simulated object based on the two or more reports. For example, server 210 may use the same reports that base station 102 relied upon for its calculation of the simulated condition and transmit a verification message or a correction message (which may include the correct calculation) to the base station 102.

According to some embodiments, base station 102 may receive, from server 210 or computing device 212, a signal instructing the base station 102 not to compute the simulated condition of the simulated object, such as for reasons discussed above. Alternatively, base station 102 may receive a signal instructing the base station 102 to compute the simulated condition of the simulated object, which is also discussed above. Additionally, base station 102 may receive, from server 210 or computing device 212, at least one value of at least one physical property of the simulated object, which base station 102 may use in it calculation of the simulated condition of the simulated object.

According to some embodiments, base station 102 may transmit, to a display device, the computed simulated condition of the simulated object. For example, the display device may be computing device 212. Additionally, the display device may be located in the environment and may receive, from the base station 102, the computed simulated condition of the simulated object. As with other functions described herein, the display function may be selectively performed with reports, with simulated conditions or with both. The display, for example, may alternate between a display of a simulated condition of an object in an environment and a current measured condition in the environment.

As noted above, the base station may perform a store and forward function, storing values and periodically communicating those values to a server or other location. In some scenarios, the forwarding will be performed based on conditions of a communication channel between the base station and the server or other receiving device. If channel conditions preclude communication for a period of time the reports and/or simulated values may be buffered. Any suitable memory architecture may be used for buffering. According to some embodiments, base station 102 may, in response to reaching a capacity threshold of the first memory 102A1, transfer at least one least recent report from the first memory 102A1 to the second memory 103B. For example, the stack in the first memory 102A1 may have a capacity of ten reports. When ten reports are stored in the stack, the base station 102 may begin transferring the oldest report from the stack in the first memory 102A1 to the circular buffer in the second memory 102A2 as each new report arrives for storage in the stack in the first memory 102A1. Additionally, the base station 102 may free space on the stack by transmitting a report to the server 210 when transmission is possible.

According to some embodiments, base station 102 may, in response to reaching a capacity threshold of the second memory 103B, delete at least one least recent report from the second memory 103B. For example, the circular buffer in the second memory 102A2 may have a capacity of about four thousand reports. When four thousand reports are stored in the circular buffer, the base station 102 may over-write the oldest report from the circular buffer, effectively deleting it, as each report is transferred from the stack in the first memory 102A1. Alternatively or additionally, the stack and circular buffer may be used to store and process simulated conditions in similar ways. The stack and circular buffer may have any other suitable capacities and are not limited to the specific capacities described herein.

Figure 1F:
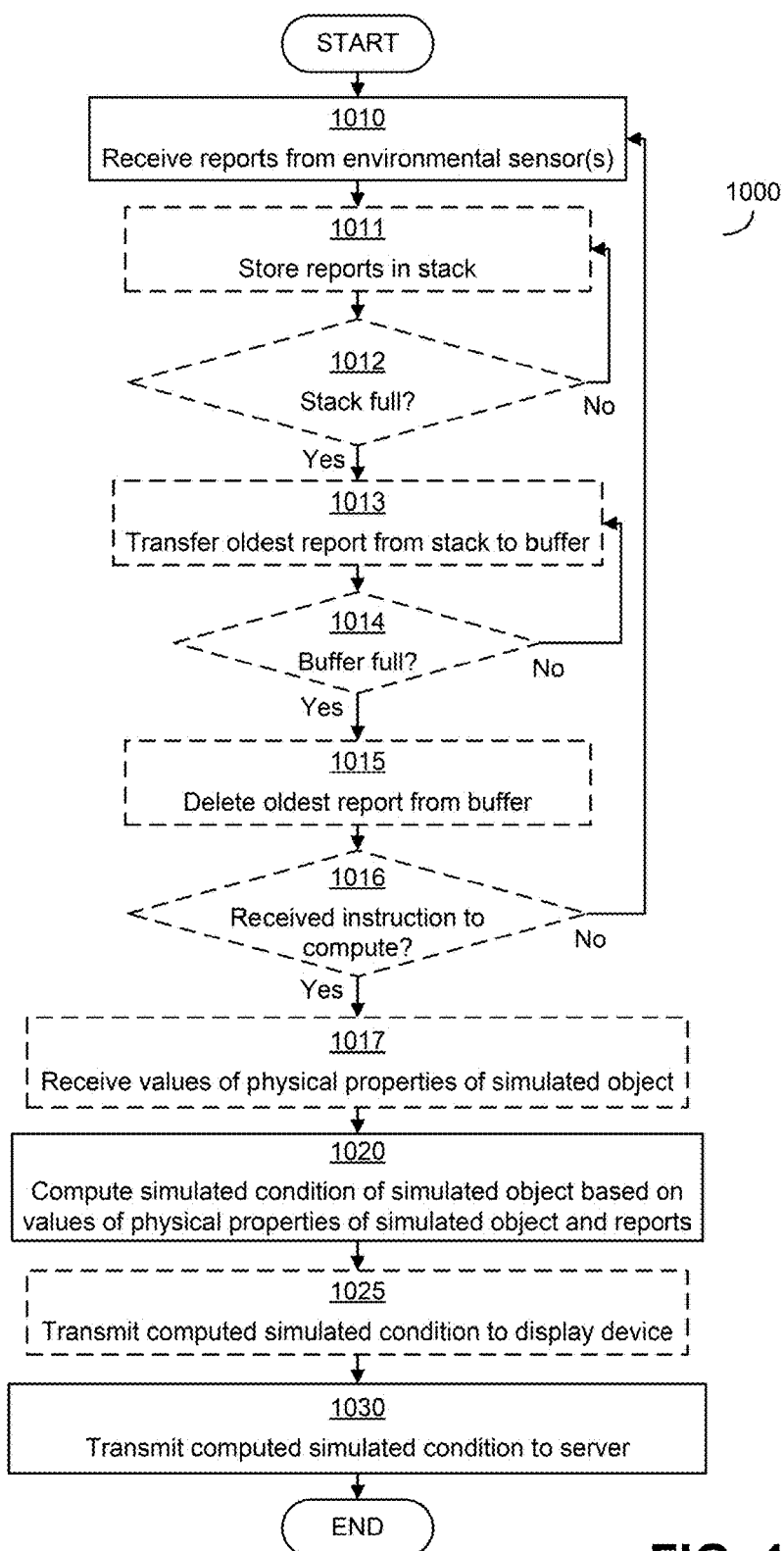
FIG. 1F is a flowchart of an exemplary technique for computing a simulated condition of a simulated object.

FIG. 1F shows an exemplary process that may be carried out by an environmental monitoring system to compute the simulated condition of a simulated object. The process of FIG. 1F may be implemented by programming of a device that processes reports from sensor units, such as base station 102. In the example of FIG. 1F, the sensor may measure the condition of the environment. As a specific example, that condition may be temperature. However, it should be appreciated that values of any one or more environmental parameters may be measured. Prior to the start of the process 1000, the sensor may be placed in an environment managed by a user and placed in wireless or wired communication with the base station of the environmental monitoring system.

Prior to initiation of process 1000, a device may be configured with information about the simulated object. This configuration may occur in any suitable way. For example, a user managing an environment may input that information. In the embodiment illustrated in FIG. 2, for example, a user may connect to server 210 over communication network 208 using a web browser or other known computer interface technology. The user may then log into an account for that user with which data about the environment sensor network 202 managed by that user is associated. The user inputs may include values of physical properties of the virtual object, which may be input in any of the ways described herein or in any other suitable way.

The user input may alternatively or additionally include one or more criterion for environmental conditions, including conditions within a simulated object. The criterion may, individually or collectively, indicate an operating state for which a user is to be notified such that, if met, the system may send a message that may alert the user or take other suitable action.

The process 1000 begins in block 1010, in which reports may be received from environmental sensor(s) of the system regarding at least one condition of the environment in which the environmental sensor(s) are disposed. The report(s) received in block 1010 may be any suitable information, including raw data collected by a sensor and/or information that results from a processing by the sensor of raw data. In the illustrative embodiments described herein, those reports may represent measured temperatures. The process 1000 may then optionally proceed to block 1011.

In block 1011, the reports (and/or simulated conditions) may be stored in a stack in a memory of the base station, such as in the first memory 102A1, as described above.

In block 1012, it may be determined whether the stack is full or has reached a capacity threshold. If the threshold has not been reached, the process 1000 may return to block 1011. Alternatively, if the threshold has been reached, the process 1000 may optionally proceed to block 1013.

In block 1013, the oldest report may be transferred from the stack to a buffer, such as the circular buffer in the second memory 102A2, as described above. Alternatively or additionally, the oldest simulated condition may be transferred from the stack to the buffer. The process 1000 may then optionally proceed to block 1014.

In block 1014, it may be determined whether the buffer is full or has reached a capacity threshold. If the threshold has not been reached, the process 1000 may return to block 1013. Alternatively, if the threshold has been reached, the process 1000 may optionally proceed to block 1015.

In block 1015, the oldest report and/or simulated condition in the buffer may be deleted, as described above. The process 1000 may then optionally proceed to block 1016.

In block 1016, it may be determined whether the base station has received an instruction to compute the simulated condition of the simulated object, such as a signal enabling the computation by the base station. If the instruction has not been received, the process 1000 may return to block 1010. Alternatively, if the instruction has been received, the process 1000 may optionally proceed to block 1017.

In block 1017, values of physical properties of the simulated object may be received, as discussed above. The process may then proceed to block 1020.

In block 1020, the simulated condition of the simulated object may be computed based on the values of physical properties of simulated object and the reports. This computation may be performed using any of the equations described herein or in any other suitable way. The process 1000 may then optionally proceed to block 1025.

In block 1025, the computed simulated condition may be transmitted to a display device, as discussed above. The process 1000 may then proceed to block 1030.

In block 1030, the reports and/or the computed simulated condition may be transmitted to the server, as discussed herein. The process 1000 then may end with respect to the report being processed. The process 1000 may be repeated for other reports as they are received. Moreover, though not shown in FIG. 1F, other processing may be performed based on the received reports. The reports, or simulated conditions computed based on the reports, may be stored for logging, trend analysis, or other purposes.

Figure 2:
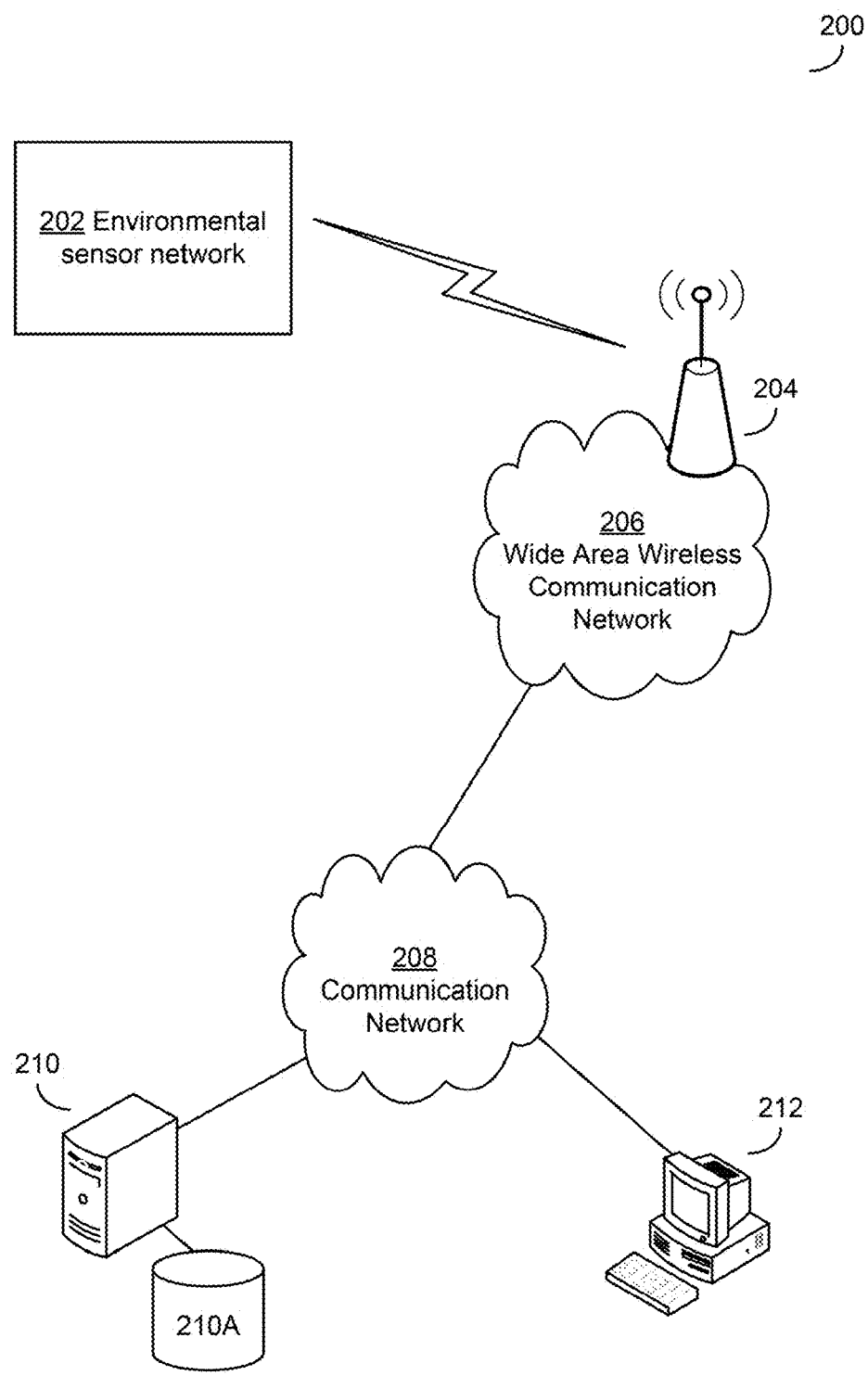
FIG. 2 is an illustration of an exemplary environmental monitoring system that may be used in some embodiments.

FIG. 2 illustrates an example of an environmental monitoring system with which some embodiments may operate. An environmental monitoring system includes at least one environmental sensor network, stores information for the environmental sensor network(s), and provides the information to users. Where an environmental monitoring system includes multiple environmental sensor networks, the environmental sensor networks may be placed within a same environment or different environments. Where there are different environments, the different environments may be managed by multiple different operators. Accordingly, an environmental monitoring system may, in some embodiments, store information regarding environments for multiple different operators.

The environmental monitoring system 200 includes an environmental sensor network 202 that may be disposed in an environment to monitor conditions in an environment and one or more servers 210 that are associated with a data store 210A. The environmental sensor network 202 may provide to the server(s) 210 and the data store 210A information that is communicated between sensor units and base stations, including information regarding conditions in the environment in which the network 202 is disposed.

To transmit the information to the server(s) 210, the environmental sensor network 202 may transmit the information regarding the conditions via at least one communication network. The transmission may be carried out in any suitable manner, as embodiments are not limited in this respect. In the example of FIG. 2, base stations of the environmental sensor network 202 transmit the information regarding the conditions in the environment to the server(s) 210 via a wireless communication protocol, which may be a high-power wireless communication protocol that is capable of transmitting information outside of the environment in which the environmental sensor network 202 is disposed. Such a high-power wireless protocol may be a Wireless Wide Area Network (WWAN) protocol. As illustrated in FIG. 2, the environmental sensor network 202 may transmit a wireless signal to an antenna 204 of a WWAN network 206. In some embodiments, the WWAN network 206 may be a cellular communication network and the antenna 204 may be a cell tower of the cellular communication network. In such embodiments, a base station of the environmental sensor network may include components to permit transmission of information via a cellular communication protocol, such as one of the Global System for Mobile Communications (GSM) protocols. When the antenna 204 receives a communication from the environmental sensor network 202, the antenna may relay the communication to the server(s) 210 via the network 206. Where the server(s) 210 are not connected to the network 206, the information from the sensor network 202 may also be transmitted via another communication network 208 that is any suitable network, including a local area network, an enterprise network, and/or the Internet.

The server(s) 210, upon receiving information from the environmental sensor network 202, may process and/or store the received information in the data store 210A in any suitable manner, as embodiments are not limited in this respect. The information that is received from the sensor network 202 and stored may include any suitable information, including information regarding conditions of an environment that the network 202 is monitoring and information regarding locations of sensor units of the environmental sensor network 202. The information may be stored for processing and/or review by an analysis facility, such as a facility that reviews the information and determines whether to raise an alert based on the review (e.g., when a temperature strays outside an acceptable operating range), and/or for review by a user who views the information via a user interface.

A user may operate a computing device 212 to communicate with the server(s) 210 to request information regarding the conditions of the environment and the server(s) 210 may respond to the request by presenting, via the computing device 212, a user interface to display the information stored in the data store 210A. The user may thereby view the information regarding conditions of the environment and take any suitable action based on the information. The user may be any suitable person authorized to view the information regarding the environment, such as a person associated with an operator of the environment. The operator of the environment may be a manager of the environment in which the sensor network 202 is disposed and may have placed the sensor network 202 in the environment or had the sensor network 202 placed in the environment. The operator of the environment may be any suitable entity that may manage an environment, such as a commercial or non-commercial entity or a human that owns and/or is responsible for the environment. A user that is associated with the operator may be the operator or may be a person affiliated with the operator, such as an employee, friend, or relative of the operator. Upon viewing the information regarding the conditions of the environment, the operator may perform various management operations based on the information, such as adjusting climate control of a room being monitored or other actions. Embodiments are not limited to working with users and/or operators that take any particular action based on information presented via the user interface.

The user interface by which the information is presented may be any suitable user interface. For example, in some embodiments, the user interface may include one or more web pages of a web site. Embodiments are not limited to presenting a user interface that includes any particular content or is in any particular format.

An environmental sensor network may be placed in an environment that is managed by a user and the environmental sensor network may be placed in communication with a server of an environmental monitoring system. The sensor network may be in communication with the server in any suitable way, including by a Wireless Wide Area Network (WWAN) connection between the sensor network and the server.

Figure 3:
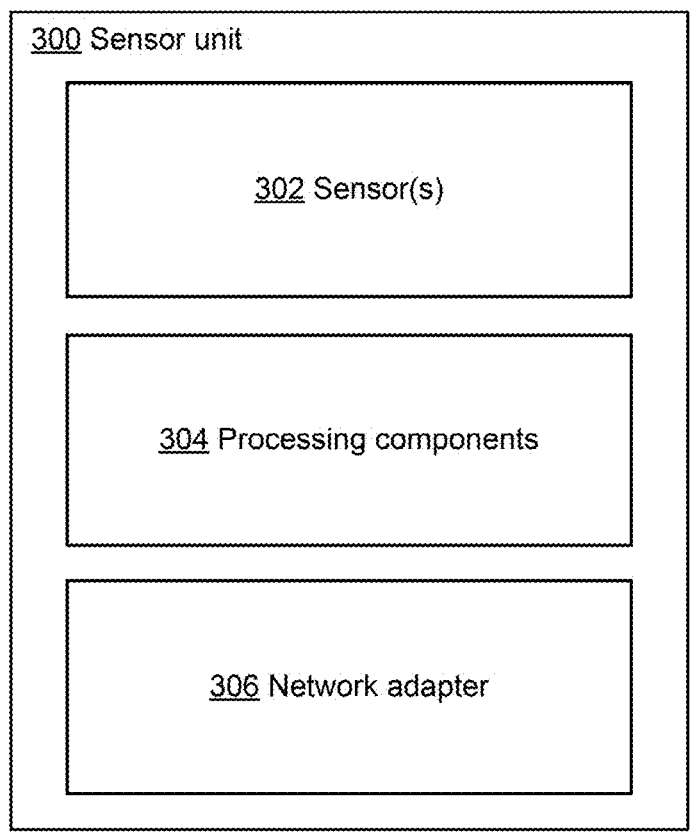
FIG. 3 is a block diagram of an exemplary sensor unit with which some embodiments may operate.

Embodiments are not limited to operating with any particular sensor units. FIG. 3 is a block diagram of some components of a sensor unit with which some embodiments may operate.

The sensor unit 300 of FIG. 3 includes various components for collecting information regarding one or more conditions of an environment in which the sensor unit is disposed. In the example of FIG. 3, these components include one or more sensors 302 that collect data regarding the conditions and processing components 304 that process at least some of the data collected by the sensors 302. Information regarding the conditions, which may include data collected by the sensors 302 and/or processed by the processing components 304, may be communicated from the sensor unit 300 via a network adapter 306. The network adapter 306 may transmit the information in any suitable manner, such as by transmitting the information via a WPAN or WLAN communication protocol and/or, in some embodiments, via a WWAN communication protocol.

FIG. 3 is an illustrative example of an architecture for a sensor unit. In some embodiments, a base station of an environmental sensing network may have a similar architecture. The architecture for a base station may not include sensor(s), as in some embodiments the base station may act as a relay device and may not participate in collecting data regarding conditions of a network. Though, in some embodiments, the base station may be implemented as a sensor unit that includes a component for communicating outside the environment or outside the sensor network. Additionally, even where the base station does not include any sensors, in some embodiments the base station may include processing components for processing data collected by sensors units. Further, the network adapter of a base station may include two adapters: a low-power adapter for communicating with sensor units and a high-power adapter for communicating with a wide-area network that extends beyond the environment. Though, it should be appreciated that embodiments are not limited to operating with any particular type of base station.

Figure 4:
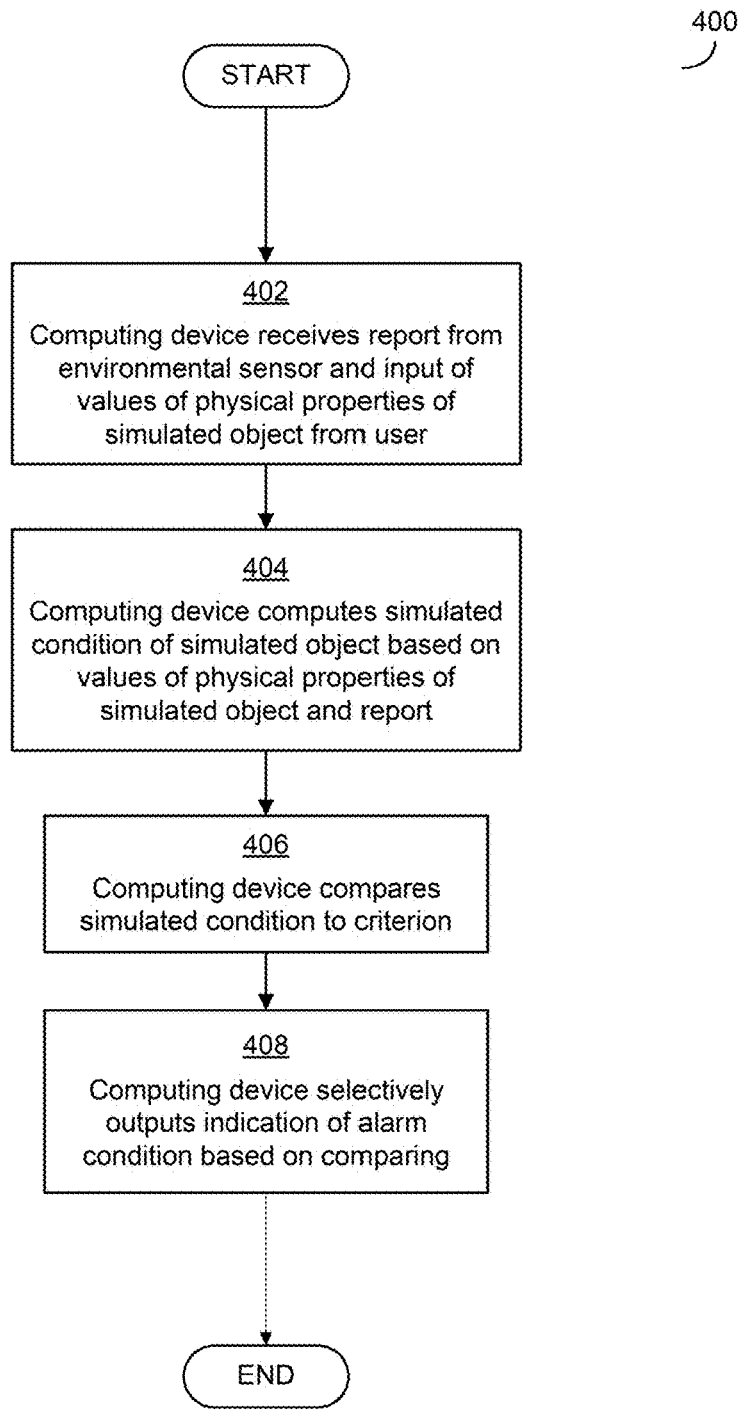
FIG. 4 is a flowchart of an additional exemplary technique for computing a simulated condition of a simulated object.

FIG. 4 shows an exemplary process that may be carried out by an environmental monitoring system to compute the simulated condition of a simulated object. The process of FIG. 4 may be implemented by programming of a computing device that processes reports from sensor units, such as server 210. In the example of FIG. 4, the sensor may measure the condition of the environment. Prior to the start of the process 400, the sensor may be placed in an environment managed by a user and placed in wireless communication with a server of the environmental monitoring system.

Prior to initiation of process 400, the computing device may be configured with information about the simulated object. This configuration may occur in any suitable way. For example, a user managing an environment may input that information. In the embodiment illustrated in FIG. 2, for example, a user may connect to server 210 over communication network 208 using a web browser or other known computer interface technology. The user may then log into an account for that user with which data about the environment sensor network 202 managed by that user is associated. The user inputs may include values of physical properties of the virtual object, which may be input in any of the ways described herein or in any other suitable way.

The user input may alternatively or additionally include one or more criterion for environmental conditions, including conditions within a simulated object. The criterion may, individually or collectively, indicate an operating state for which a user is to be notified such that, if met, the system may send a message that may alert the user or take other suitable action.

The process 400 begins in block 402, in which a computing device of an environmental monitoring system receives from an environmental sensor of the system one or more reports regarding at least one condition of the environment in which the environmental sensor is disposed. The report(s) received in block 402 may be any suitable information, including raw data collected by a sensor and/or information that results from a processing by the sensor of raw data. The computing device also receives an input of values of physical properties of a simulated object from a user through a user interface. In the illustrative embodiments described herein, those reports may represent measured temperatures.

In block 404, the computing device computes a simulated condition of the simulated object based on the values of physical properties of simulated object and the report received in block 402. This computation may be performed using any of the equations described herein or in any other suitable way.

In block 406, the computing device compares the simulated condition computed in block 404 to one or more criterion, as discussed above. The result of this comparison may be a determination that an alarm condition exists. The alarm condition, for example, may be that the temperature or other environmental condition, as simulated within the simulated object, exceeds a threshold or other limit. Alternatively or additionally, the alarm condition may be that the rate of change of the simulated environmental condition exceeds that threshold or other limit. However, an alarm condition may be determined in any suitable way, including ways as described herein.

In block 408, the computing device selectively outputs an indication of the alarm condition (described above) based on the comparing performed in block 406. The indication of the alarm condition may be output in any suitable way. For example, the indication may be a message sent over a computer network or a message sent over another communication network, such as the cellular telephone network in the form of an SMS message. However, any suitable technique for communicating information to one or more people, computers, or other devices may be used, including the techniques described herein.

The process 400 then may end with respect to the report being processed. The process 400 may be repeated for other reports as they are received. Moreover, though not shown in FIG. 4, other processing may be performed based on the received report. The report, or simulated conditions computed based on the report, may be stored for logging, trend analysis, or other purposes.

Figure 5:
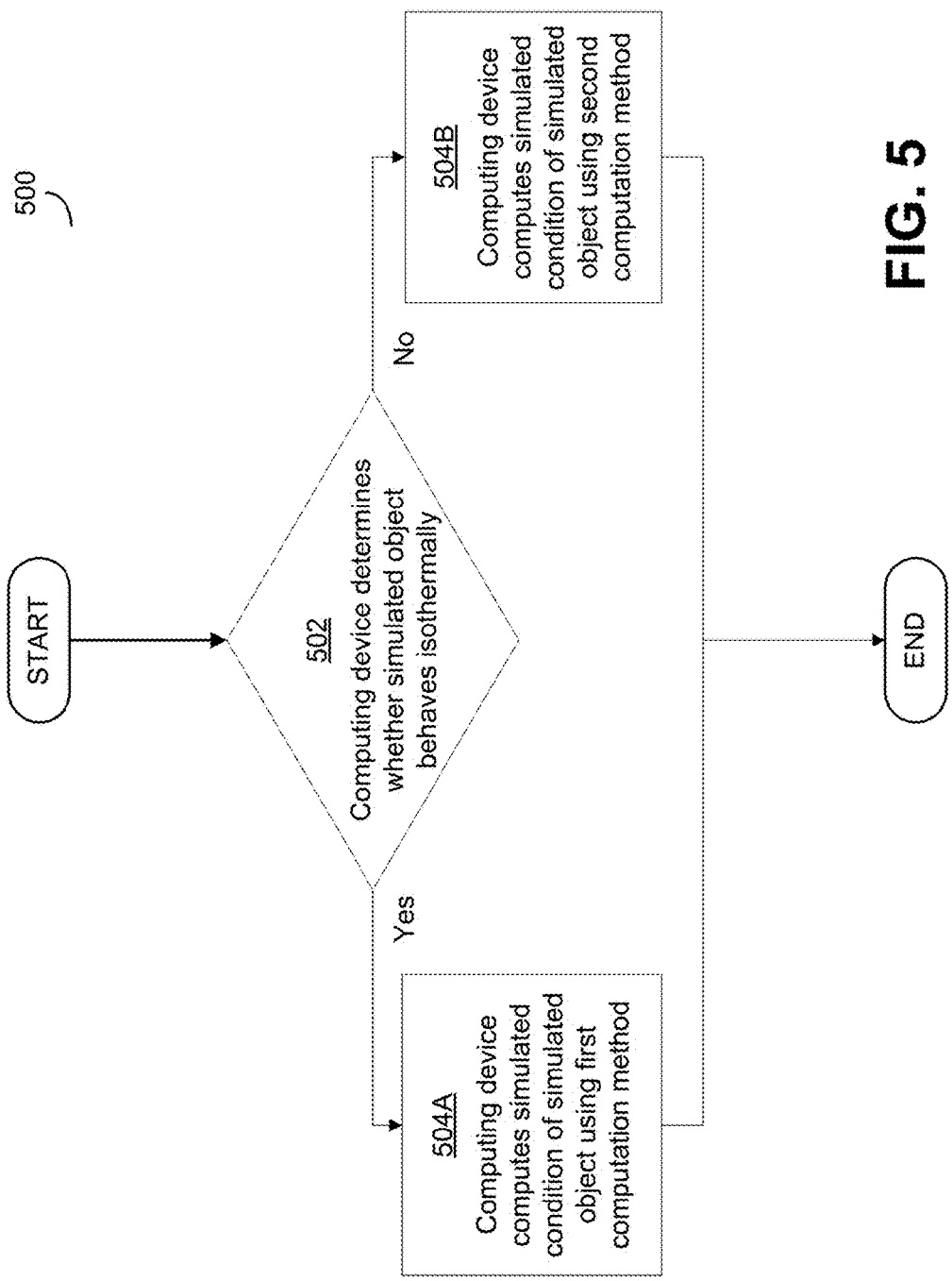
FIG. 5 is a flowchart of an exemplary sub-technique of the technique of FIG. 4.

FIG. 5 illustrates a sub-process expanding upon block 404 from process 400, in accordance with some exemplary embodiments. Sub-process 500 may be implemented by a computing device to compute a physical property of a simulated object. In this example, the physical property is an internal temperature of the simulated object.

The process 500 of FIG. 5 may begin in block 502, in which the computing device determines whether the simulated object behaves isothermally. Such a determination may be made in any suitable way. In some embodiments, the characteristics of the simulated object may be determined from information about the simulated object gleaned from user input defining the simulated object. In some scenarios, the characteristics of the simulated object may be input directly or may be inferred from other characteristics or information about the simulated object or object to be simulated.

If the simulated object behaves isothermally, in block 504A, the computing device computes the simulated condition of the simulated object using a first computation method (described above). If the simulated object does not behave isothermally, in block 504B, the computing device computes the simulated condition of the simulated object using a second computation method (described above). The process 500 then ends. Any suitable computation methods may be used, including those described herein.

Figure 6:
FIG. 6 is a sketch of an exemplary graphical user interface that may be presented by the system of FIG. 2 to a user.

Embodiments are not limited to operating with any particular user interface. FIG. 6 illustrates an example of an user interface that may be used in some embodiments.

Techniques operating according to the principles described herein may be implemented in any suitable manner. Included in the discussion above are flow charts showing the steps and acts of various processes. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner, including as computer-readable storage media 806 of FIG. 8 described below (i.e., as a portion of a computing device 800) or as a stand-alone, separate storage medium. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Further, some techniques described above comprise acts of storing information (e.g., data and/or instructions) in certain ways for use by these techniques. In some implementations of these techniques—such as implementations where the techniques are implemented as computer-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as computer-executable instructions, these instructions may be executed on one or more suitable computing device(s) operating in any suitable computer system, including the exemplary computer system of FIG. 2, or one or more computing devices (or one or more processors of one or more computing devices) may be programmed to execute the computer-executable instructions. A computing device or processor may be programmed to execute instructions when the instructions are stored in a manner accessible to the computing device/processor, such as in a local memory (e.g., an on-chip cache or instruction register, a computer-readable storage medium accessible via a bus, a computer-readable storage medium accessible via one or more networks and accessible by the device/processor, etc.). Functional facilities that comprise these computer-executable instructions may be integrated with and direct the operation of a single multi-purpose programmable digital computer apparatus, a coordinated system of two or more multi-purpose computer apparatuses sharing processing power and jointly carrying out the techniques described herein, a single computer apparatus or coordinated system of computer apparatuses (co-located or geographically distributed) dedicated to executing the techniques described herein, one or more Field-Programmable Gate Arrays (FPGAs) for carrying out the techniques described herein, or any other suitable system.

Figure 8:
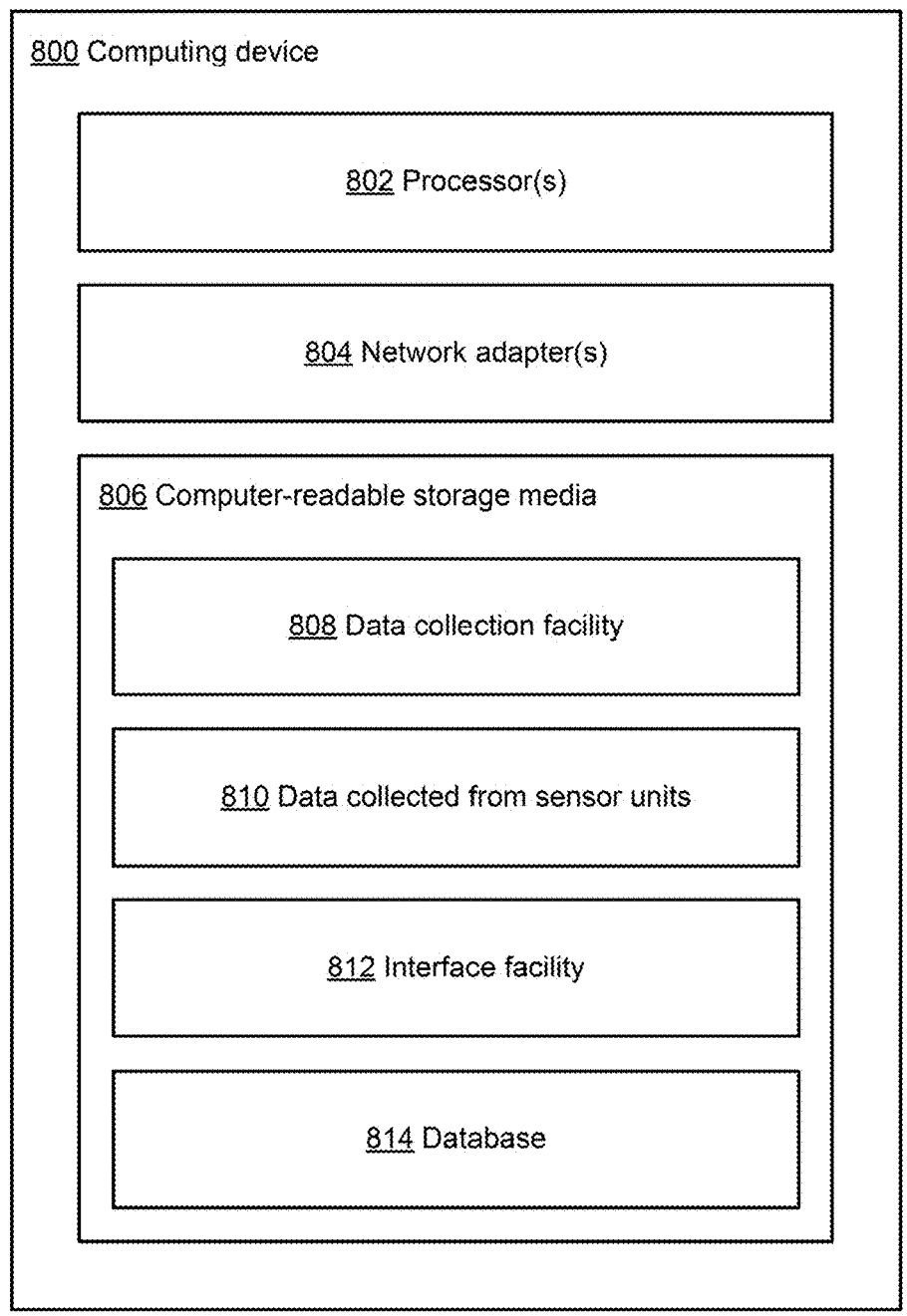
FIG. 8 is a block diagram of an exemplary computing device with which some embodiments may operate.

FIG. 8 illustrates one exemplary implementation of a computing device in the form of a computing device 800 that may be used in a system implementing the techniques described herein, although others are possible. It should be appreciated that FIG. 8 is intended neither to be a depiction of necessary components for a computing device to operate in accordance with the principles described herein, nor a comprehensive depiction.

Computing device 800 may comprise at least one processor 802, a network adapter 804, and computer-readable storage media 806. Computing device 800 may be, for example, a desktop or laptop personal computer, a personal digital assistant (PDA), a smart mobile phone, a server, a wireless access point or other networking element, or any other suitable computing device. Network adapter 804 may be any suitable hardware and/or software to enable the computing device 800 to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media 806 may be adapted to store data to be processed and/or instructions to be executed by processor 802. Processor 802 enables processing of data and execution of instructions. The data and instructions may be stored on the computer-readable storage media 806 and may, for example, enable communication between components of the computing device 800.

The data and instructions stored on computer-readable storage media 806 may comprise computer-executable instructions implementing techniques which operate according to the principles described herein. In the example of FIG. 8, computer-readable storage media 806 stores computer-executable instructions implementing various facilities and storing various information as described above. Computer-readable storage media 806 may store an information collection facility 808 that receives information communicated by one or more environmental sensor networks disposed in one or more environments. The information collection facility 808 may receive the data via the network adapter 804. The computer-readable storage media 806 may further store information 810 that has been received from the sensor networks and an interface facility 812 for presenting the information to a user. The interface facility 812 may present the information to the user via any suitable user interface, including via one or more web pages that may be transmitted to the user via the network adapter 804. The computer-readable storage media 806 may also store one or more databases 814 that contain information such as the values of the physical properties of potentially selectable simulated objects.

While not illustrated in FIG. 8, a computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. An environmental monitoring system comprising:
a base station configured to:
receive at least two reports from at least one environmental sensor in an environment at a location other than on or in an object to be simulated within the environment;

compute, based on values of physical properties of a simulated object and the at least two reports, a simulated condition of the simulated object within the environment; and transmit, to a computing device, at least the computed simulated condition of the simulated object, wherein the simulated condition of the simulated object comprises at least one condition simulated within a simulated interior of the simulated object.

2. The environmental monitoring system of claim 1, wherein:

the base station is located in the environment.

3. The environmental monitoring system of claim 1, wherein:

the computing device is configured to:

receive, from the base station, the computed simulated condition of the simulated object;

compare the simulated condition to a criterion; and selectively output an indication of an alarm condition based on the comparing.

4. The environmental monitoring system of claim 3, wherein:

the computing device is further configured to:

receive, from the base station, the at least two reports; and verify the computed simulated condition of the simulated object based on the at least two reports.

5. The environmental monitoring system of claim 1, wherein:

the base station is further configured to:

receive, from the computing device, a signal instructing the base station not to compute the simulated condition of the simulated object;

receive, from the computing device, a signal instructing the base station to compute the simulated condition of the simulated object; and/or receive, from the computing device, at least one value of at least one physical property of the simulated object.

6. The environmental monitoring system of claim 1, wherein:

the base station is further configured to:

transmit, to a display device, the computed simulated condition of the simulated object.

7. The environmental monitoring system of claim 6, wherein:

the display device is located in the environment and is configured to receive, from the base station, the computed simulated condition of the simulated object.

8. The environmental monitoring system of claim 1, wherein:

the environment is a refrigerator or an oven that stores a plurality of objects.

9. The environmental monitoring system of claim 1, wherein:

the computing device is configured to:

receive, from the base station, the computed simulated condition of the simulated object;

compare a rate of change of the simulated condition to a criterion; and selectively output an indication of an alarm condition based on the comparing.

10. An environmental monitoring system comprising:

a base station configured to:

receive at least two reports from at least one environmental sensor in an environment;

wherein the base station comprises:

a first memory configured to store a first plurality of reports and/or a condition computed based on the at least two reports in a stack; and a second memory configured to store a second plurality of reports in a buffer, wherein:

the second memory has a lower data processing rate than the first memory, and the second memory has a higher data capacity than the first memory; and a transmission control circuit configured to control transmission from the first memory and/or the second memory to a computing device based on detection of a connection to the computing device.

11. The environmental monitoring system of claim 10, wherein:

the first plurality of reports is more recent than the second plurality of reports.

12. The environmental monitoring system of claim 10, wherein:

the base station is configured to:

in response to reaching a first capacity threshold of the first memory, transfer at least one least recent report from the first memory to the second memory; and in response to reaching a second capacity threshold of the second memory, delete at least one least recent report from the second memory.

13. At least one non-transitory computer-readable storage medium encoded with executable instructions that, when executed by at least one processor, cause the at least one processor to perform a method of operating a base station of an environmental monitoring system, the method comprising:

receiving a plurality of reports from at least one environmental sensor in an environment at a location other than on or in an object to be simulated within the environment;

computing, based on values of physical properties of a simulated object and the plurality of reports, a simulated condition of the simulated object within the environment; and transmitting, to a server, at least two of the plurality of reports and the computed simulated condition of the simulated object, wherein the simulated condition of the simulated object comprises at least one condition simulated within a simulated interior of the simulated object.

14. The at least one non-transitory computer-readable storage medium of claim 13, the method further comprising:

receiving, from the server, a signal instructing the base station not to compute a simulated condition of the simulated object; and based on the signal, transmitting to the server at least a portion of the stream of reports.

15. The at least one non-transitory computer-readable storage medium of claim 13, the method further comprising:

transmitting, to a display device, the computed simulated condition of the simulated object.

16. The at least one non-transitory computer-readable storage medium of claim 13, the method further comprising:

buffering a stream of computed simulated conditions; and transmitting, based on conditions of a communication link between the base station and the server, the buffered stream of computed simulated conditions.

17. The at least one non-transitory computer-readable storage medium of claim 16, wherein:

transmitting the buffered stream of computed simulated conditions comprises transmitting most recently computed simulated conditions before previously computed, buffered simulated conditions.

18. The at least one non-transitory computer-readable storage medium of claim 16, wherein:
   a first plurality of the computed simulated conditions are stored in a stack in a first memory; and
   a second plurality of the computed simulated conditions are stored in a buffer in a second memory, and
   the method further comprises:
      in response to reaching a first capacity threshold of the first memory, transferring at least one least recent computed simulated condition from the first memory to the second memory; and
      in response to reaching a second capacity threshold of the second memory, deleting at least one least recent computed simulated condition from the second memory.

19. The at least one non-transitory computer-readable storage medium of claim 13, wherein the environment is a refrigerator or an oven and the plurality of reports are of at least one temperature within the refrigerator or oven.

20. The at least one non-transitory computer-readable storage medium of claim 13, wherein the method further comprises:
   comparing a rate of change of the simulated condition to a criterion; and
   selectively outputting an indication of an alarm condition based on the comparing.

\* \* \* \* \*